United States Patent
Yang et al.

(10) Patent No.: US 11,104,984 B2
(45) Date of Patent: Aug. 31, 2021

(54) EVAPORATION MASK AND EVAPORATION METHOD

(71) Applicants: BOE TECHNOLOGY GROUP CO., LTD, Beijing (CN); ORDOS YUANSHENG OPTOELECTRONICS CO., LTD., Inner Mongolia (CN)

(72) Inventors: Fan Yang, Beijing (CN); Yinan Liang, Beijing (CN); Kun Guo, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 487 days.

(21) Appl. No.: 16/066,222

(22) PCT Filed: Jun. 27, 2017

(86) PCT No.: PCT/CN2017/090231
§ 371 (c)(1),
(2) Date: Jun. 26, 2018

(87) PCT Pub. No.: WO2018/099055
PCT Pub. Date: Jun. 7, 2018

(65) Prior Publication Data
US 2020/0270741 A1    Aug. 27, 2020

(30) Foreign Application Priority Data
Nov. 30, 2016 (CN) .......................... 201611075496.4

(51) Int. Cl.
C23C 14/04 (2006.01)
C23C 14/24 (2006.01)
(Continued)

(52) U.S. Cl.
CPC ............ C23C 14/042 (2013.01); C23C 14/24 (2013.01); H01L 51/001 (2013.01);
(Continued)

(58) Field of Classification Search
CPC ........ C23C 14/042; C23C 14/24; H01L 51/56
See application file for complete search history.

(56) References Cited

U.S. PATENT DOCUMENTS

2006/0158088 A1    7/2006    Kim et al.
2012/0266813 A1    10/2012   Hong

FOREIGN PATENT DOCUMENTS

CN    101497984 A    8/2009
CN    102760842 A    10/2012
(Continued)

OTHER PUBLICATIONS

International Search Report and Written Opinion dated Sep. 11, 2017; PCT/CN2017/090231.
(Continued)

*Primary Examiner* — Anthony Ho

(57) ABSTRACT

An evaporation mask and an evaporation method are disclosed. The evaporation mask includes a blocking region and a plurality of evaporation regions arranged in an array. Each of the plurality of evaporation regions is integrally formed as an opened structure; the blocking region is disposed to surround each of the evaporation regions to separate adjacent evaporation regions; and the blocking region is provided with a plurality of perforated structure.

17 Claims, 3 Drawing Sheets

(51) Int. Cl.
*H01L 51/00* (2006.01)
*H01L 51/56* (2006.01)
*H01L 51/50* (2006.01)
*H01L 51/52* (2006.01)

(52) U.S. Cl.
CPC ...... *H01L 51/0011* (2013.01); *H01L 51/0021* (2013.01); *H01L 51/56* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5221* (2013.01)

(56) References Cited

FOREIGN PATENT DOCUMENTS

| | | |
|---|---|---|
| CN | 103695841 A | 4/2014 |
| CN | 104018116 A | 9/2014 |
| CN | 106521412 A | 3/2017 |
| JP | 2007-280774 A | 10/2007 |
| WO | 2016/104207 A1 | 6/2016 |

OTHER PUBLICATIONS

The First Chinese Office Action dated May 3, 2018; Appln. No. 201611075496.4.

EVAPORATION MASK AND EVAPORATION METHOD

TECHNICAL FIELD

At least one embodiment of the present disclosure relates to an evaporation mask and an evaporation method.

BACKGROUND

Organic light-emitting diode (OLED) display is a type of self-luminous display device. The OLED display has become increasingly popular in market for its advantageous such as low power consumption, high display brightness, wide viewing angle and quick response.

Generally, an OLED includes a cathode, a functional layer and an anode. The functional layer includes a hole injection layer, a hole transmission layer, a hole barrier layer, an organic light-emitting layer, an electron transmission layer, an electron barrier layer and an electron injection layer. The functional layer may be obtained by various film forming methods, in which an evaporation method is widely used in forming functional film layers such as the light-emitting layer attributed to its advantageous such as simple operation, easily controllable film thickness and easy implementation of doping; that is, heating an evaporation material under a vacuum circumstance to cause the evaporation material to be evaporated and then deposited onto a target substrate, so as to form a corresponding film layer.

SUMMARY

At least one embodiment of the present disclosure provides an evaporation mask and an evaporation method. By utilizing the evaporation mask and the evaporation method, it achieves both of improving a display effect of a display device and ensuring a normal condition of a periphery region for display, so as to guarantee a yield of product appearance detection.

At least one embodiment of the present disclosure provides an evaporation mask, including a blocking region and a plurality of evaporation regions arranged in an array. Each of the plurality of evaporation regions is integrally formed as an opened structure; the blocking region is disposed to surround each of the evaporation regions to separate adjacent evaporation regions; and the blocking region is provided with a plurality of via holes.

For example, in an evaporation mask provided by an embodiment of the present disclosure, the plurality of via holes is disposed in an area of the blocking region closer to each of the evaporation regions.

For example, in an evaporation mask provided by an embodiment of the present disclosure, the plurality of via holes is configured to penetrate through the blocking region.

For example, in an evaporation mask provided by an embodiment of the present disclosure, the plurality of via holes is disposed in an annular area which surrounds each of the evaporation regions and has a width of 60 microns.

For example, in an evaporation mask provided by an embodiment of the present disclosure, each cross section of the plurality of via holes taken along a direction parallel to the evaporation mask has a maximum size which is in a range from 30 microns to 60 microns.

For example, in an evaporation mask provided by an embodiment of the present disclosure, an interval of the plurality of via holes is in a range from 30 microns to 40 microns.

For example, in an evaporation mask provided by an embodiment of the present disclosure, each cross section of the plurality of via holes taken along a direction parallel to the evaporation mask has a shape including circle or polygon.

For example, in an evaporation mask provided by an embodiment of the present disclosure, the blocking region includes a plurality of first blocking bars and a plurality of second blocking bars; the plurality of first blocking bars extends along a first direction, the plurality of second blocking bars extends along a second direction; and the first blocking bars and the second blocking bars are disposed to be intersected.

For example, in an evaporation mask provided by an embodiment of the present disclosure, the first blocking bars and the second blocking bars are disposed to be intersected vertically to define a plurality of evaporation regions each having a rectangular shape.

For example, in an evaporation mask provided by an embodiment of the present disclosure, a shape of each of the evaporation regions includes polygon or circle.

For example, in an evaporation mask provided by an embodiment of the present disclosure, a shape of the perforated structure in the evaporation region is identical to that of a common layer to be evaporated.

For example, in an evaporation mask provided by an embodiment of the present disclosure, the common layer includes at least one of a hole transmission layer, an electron transmission layer, a hole injection layer, an electron injection layer, a hole barrier layer, an electron barrier layer and a cathode layer.

At least one embodiment of the present disclosure provides an evaporation method, including: evaporating a film layer having a shape identical to that of the perforated structure on a substrate by utilizing the above-mentioned evaporation mask.

For example, in an evaporation method provided by an embodiment of the present disclosure, the film layer includes a common layer to be evaporated.

For example, in an evaporation method provided by an embodiment of the present disclosure, evaporating the common layer includes evaporating at least one of a hole transmission layer, an electron transmission layer, a hole injection layer, an electron injection layer, a hole barrier layer, an electron barrier layer and a cathode layer.

BRIEF DESCRIPTION OF THE DRAWINGS

Hereinafter, the drawings of embodiments will be briefly introduced so as to provide more definite explanations of the embodiments of the present disclosure. Obviously, the drawings described as below merely refer to some embodiments of the present disclosure and are not intended to constitute any limitation to the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the invention. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
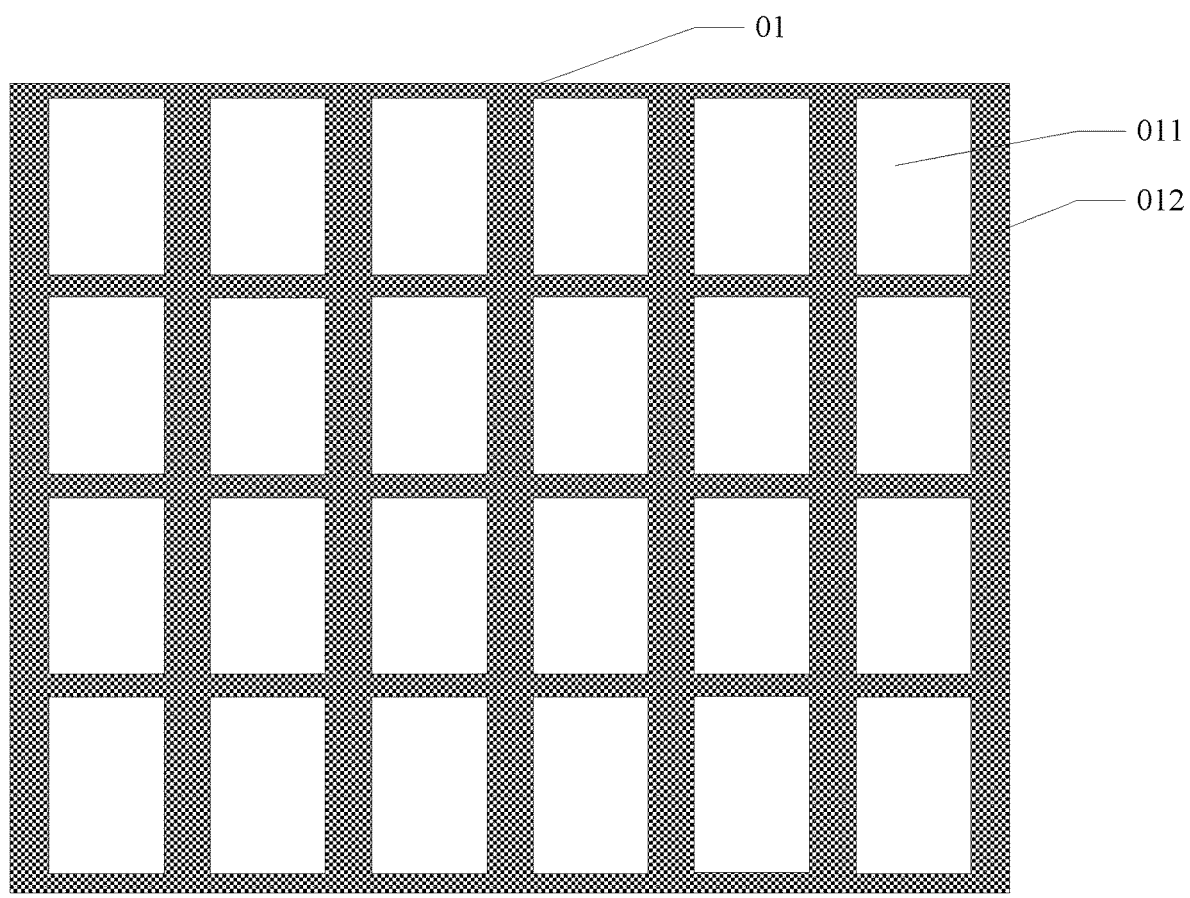
FIG. 1 is a schematic diagram illustrating an evaporation mask.

FIG. 1 is a schematic diagram illustrating an evaporation mask. As illustrated in FIG. 1, during a manufacturing process of an OLED display device, an evaporation mask 01 with an opened structure is utilized to evaporate a common layer; the opened structure has a shape identical to that of the common layer to be evaporated, for example, the opened structure and the common layer have comparable sizes. The common layer to be evaporated usually is a film layer with a relatively larger thickness, including a hole injection layer, a hole transmission layer, a hole barrier layer, an electron transmission layer, an electron barrier layer, an electron injection layer, and the like. The evaporation mask 01 includes a plurality of evaporation regions 011 arranged in an array, and a blocking region 012 disposed to surround each of the evaporation regions 011; the blocking region 012 is configured to separate every adjacent evaporation regions 011. During evaporating the common layer onto an OLED display substrate to which the evaporation region 011 corresponds, particles with a relatively larger diameter as generated are liable to be attached onto the blocking region 012. When such relatively larger particle has a size exceeding 100 microns, e.g., when a diameter of the particle is about 200 microns, an edge of the evaporation region 011 may be partly blocked, which would result in an uneven edge of the common layer as evaporated and hence affect an evaporation effect at a periphery region for display such as a scanning drive circuit region and an evaporation effect at a display region. In panel detection, dim spots or dark spots with varied levels may be occurred in the display region when lighted, and affect a yield of appearance detection of the display region. From the other aspect, because the evaporation mask 01 is extremely closer to the substrate to be evaporated, for example, a distance there-between may be 3 microns, the relatively larger particles attached onto the blocking region 012 at the edge of the evaporation regions 011 may be further attached onto the substrate being evaporated, which may affect the display effect at the periphery region for display such as the scanning drive circuit region and cause a yellowed phenomenon or dark spots, thereby affecting the yield of appearance detection to the periphery region for display. In addition, during packaging, part of the relatively larger particles attached onto the substrate may result in an uneven bonding with a cover glass and a phenomenon of air leakage.

At least one embodiment of the present disclosure provides an evaporation mask, including a blocking region and a plurality of evaporation regions arranged in an array. Each of the plurality of evaporation regions is integrally formed as an opened structure; the blocking region is disposed to surround each of the evaporation regions to separate adjacent evaporation regions; and the blocking region is provided with a plurality of via holes. By utilizing such evaporation mask, it cannot only improve the display effect of the display device but also ensure a normal condition in the periphery region for display, thereby guaranteeing the yield of product appearance detection.

At least one embodiment of the present disclosure provides an evaporation method, including: evaporating a film layer having a shape identical to that of the perforated structure on a substrate by utilizing the above-mentioned evaporation mask. In the evaporation method, by sequentially evaporating film layers through utilizing the above-mentioned evaporation mask, it cannot only improve the display effect of the display device but also ensure a normal condition in the periphery region for display, thereby guaranteeing the yield of product appearance detection.

Hereinafter description will be given with reference to several embodiments.

The First Embodiment

Figure 2:
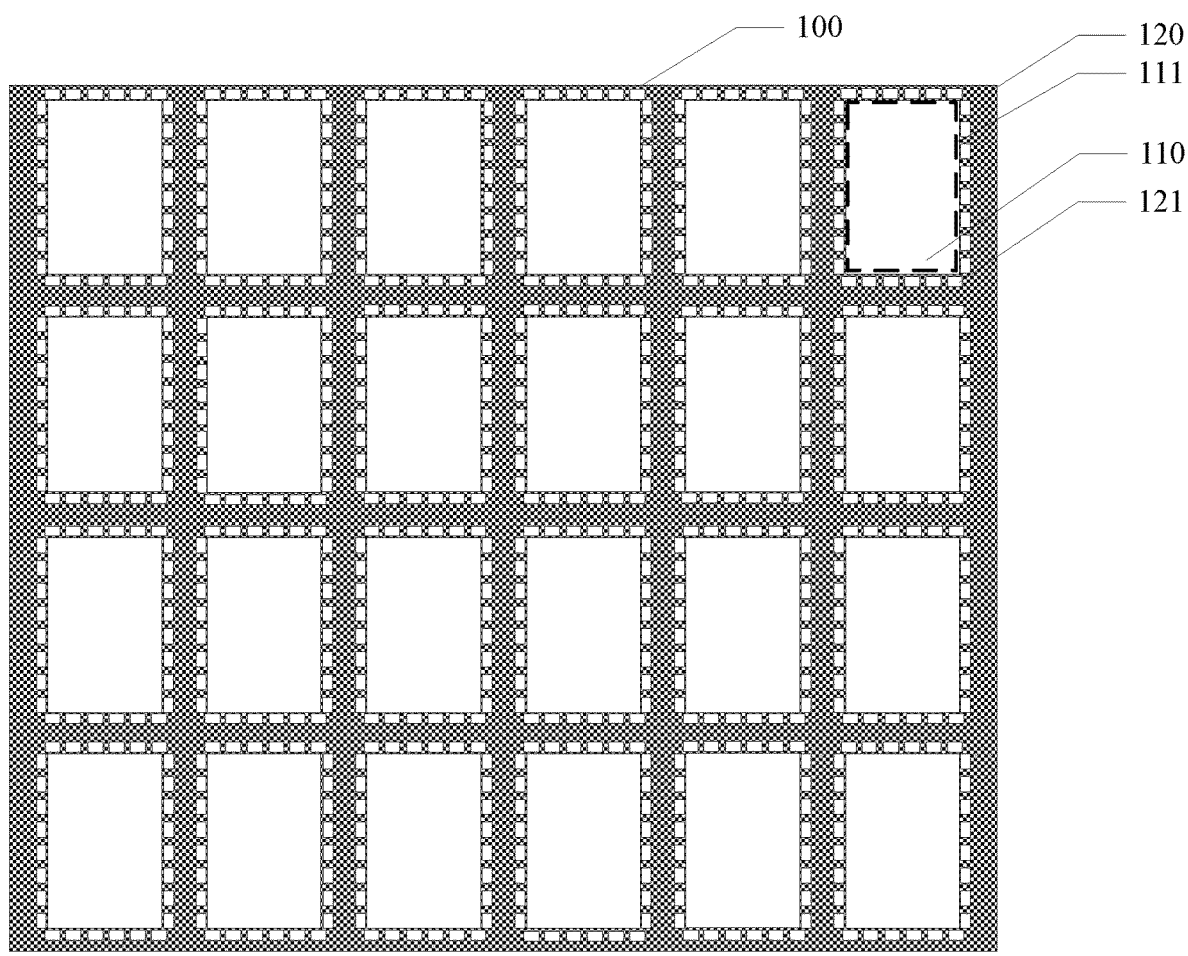
FIG. 2 is a schematic diagram illustrating an evaporation mask provided by an embodiment of the present disclosure.

The present embodiment provides an evaporation mask. As illustrated in FIG. 2, the evaporation mask 100 includes a blocking region 120 and a plurality of evaporation regions 110 arranged in an array. Each of the plurality of evaporation regions 110 is integrally formed as an opened structure 111; the blocking region 120 is disposed to surround each of the evaporation regions 110 to separate adjacent evaporation regions 110; and the blocking region 120 is provided with a plurality of via holes 121. The perforated structure 121 may be formed by etching, without limited herein. The blocking region 120 as illustrated in FIG. 2 is disposed to surround each of the evaporation regions 110; that is, each evaporation mask unit includes one evaporation region 110 with an opened structure 111 and a blocking region 120 surrounding the evaporation region 110, in which the blocking region 120 can separate evaporation regions 110 in adjacent evaporation mask units.

The blocking region 120 in the present embodiment can prevent an evaporation material from being evaporated onto an area of the substrate provided with the blocking region. The evaporation region 110 with the opened structure 111 allows the evaporation material to be passed there-through, so as to evaporate an area of the substrate to be evaporated, e.g., an OLED display substrate, which is corresponding to the evaporation region 110. It should be explained that, the evaporation region 110 in the present embodiment mainly serves to evaporate a common layer in the OLED display substrate, so as to improve a luminous efficiency. Generally, during evaporating the common layer, particles with relatively larger diameter generated by the evaporation source are liable to be attached onto the blocking region attributed to the effect of thermal shock. As the evaporation source sequentially evaporates the common layers in the OLED display substrate, the particles attached onto the blocking region would be gradually accumulated and grown in size to the extent of affecting the evaporation effect. The present embodiment utilizes the blocking region 120 provided with opened structure 121 to reduce an area on the blocking region 120 attached with the large particles, which can effectively weaken an adhesive force of the particles on the blocking region 120, thereby decreasing an amount of the large particles as attached and improving the evaporation effect. It should be explained that, the present embodiment is described with reference to the case of evaporating an OLED display substrate with the evaporation mask 100 by way of example, without limiting the present disclosure thereto; for example, the display substrate may be of other types.

For example, during evaporating a first layer of the common layers, part of the large particles may be difficult to be attached onto the blocking region 120 because of the existence of the opened structure 121 on the blocking region 120 which reduces the area of the blocking region 120 attached with particles, and the other part of the large particles attached onto the blocking region 120 will be gathered with other small particles during evaporating subsequent common layer(s) and formed into even larger particles. The newly formed larger particles that are increased in weight can no longer be supported by the area on the blocking region 120 previously allowing particles to be attached, and will be separated from the blocking region 120. In this way, the amount of large particles attached on the blocking region is reduced. Therefore, by arranging the opened structure 121 in the blocking region 120, it can effectively prevent the particles from aggregating during subsequent evaporation processes, and hence prevents the diameter of the particles from being continuously increased, so as to advance the evaporation effect, improve an uniformity of the display region and ensure the normal condition in the periphery region for display.

For example, as illustrated in FIG. 2, the dashed-line block in the evaporation region 110 indicates that each evaporation region 110 is integrally formed as an opened structure 111, and the opened structure 111 has a shape identical to that of the common layer to be evaporated; for example, the opened structure and the common layer have considerable sizes. It should be explained that, apart from the display region, the opened structure 111 also corresponds to the periphery region for display, such as the scanning drive circuit region. Because the evaporation mask 100 is extremely closer to the substrate to be evaporated, for example, a distance there-between is about 3 microns, relatively larger particles are liable to be attached onto a periphery of the scanning drive circuit region. Therefore, the blocking region 120 in the present embodiment is provided with the opened structure 121 to effectively prevent the relatively large particles from attaching onto the periphery of the scanning drive circuit region, so as to solve defect issues occurred in the periphery region for display during the appearance detection, such as yellowed phenomenon and dark spots.

For example, the opened structure 111 of each evaporation region 110 allows the evaporation material to be passed there-through so as to evaporate the area on the OLED display substrate to be evaporated corresponding to the opened structure 111. For example, the common layer as evaporated may cover a plurality of pixel electrodes, that is, the common layer as evaporated may be formed on the plurality of pixel electrodes. For example, the common layer may be disposed between the electrode and the light-emitting layer, and used for respective pixels as a carrier transmission layer. It should be explained that, the common layer evaporated by each evaporation layer 110 corresponds to a common layer of one OLED display device. Therefore, the evaporation mask 100 including a plurality of evaporation regions 110 arranged in an array can evaporate a plurality of substrates to be evaporated at the same time.

For example, at least one of the common layers as evaporated is depending on a material and a luminescent property of the light-emitting layer. For example, the common layer may include at least one of a hole transmission layer, an electron transmission layer, a hole injection layer, an electron injection layer, a hole barrier layer, an electron barrier layer and a cathode layer.

For example, the hole injection layer may include a conductive polymer with a metal composition. The hole injection layer may include phthalocyanine compound including copper phthalocyanine, polyaniline/dodecylbenzene sulfonic acid, polyaniline/camphorsulfonic acid or polyaniline, and the like. However, the hole injection layer is not limited thereto.

For example, the hole transmission layer may include carbazole derivatives such as polyvinyl carbazole, or amine derivatives with condensed Aromatic ring. However, the hole transmission layer is not limited thereto. For example, the hole transmission layer may increase a difference in energy level between the hole injection layer and the light-emitting layer so as to increase a mobility of holes injected into the electrode layer.

For example, the electron transmission layer is formed on the light-emitting layer, and may include a material such as quinoline derivative to improve an electron mobility, so as to achieve a charge balance. However, the electron transmission layer is not limited thereto.

For example, the electron injection layer is formed on the electron transmission layer, and includes a material such as lithium fluoride, sodium chloride and barium oxide. However, the electron injection layer is not limited thereto.

For example, the cathode layer may be formed of a material with high conductivity and low work function. The material of the cathode layer may be Li, Mg, Ca, Al, Ag, Ba or an alloy thereof. However, the material of the cathode layer is not limited thereto. For example, the cathode layer may be a transmission electrode layer or a reflective electrode layer. When the cathode layer is a transmission electrode layer, the material of the cathode layer includes above-mentioned transparent conductive materials. When the cathode layer is a reflective electrode layer, the cathode layer includes a metal reflective layer.

For example, the evaporation region 110 is not limited to evaporate the above-mentioned common layer, but may be utilized to evaporate an optical enhancement film layer of the OLED display substrate and the like, without particularly limited in the embodiments of the present disclosure.

For example, the material of the blocking region 120 may include resin material or metallic material. For example, the metallic material may be one or more selected from the group consisted of stainless steel, nickel (Ni), cobalt (Co), Ni-alloy and Ni—Co-alloy, without limiting the present embodiment thereto.

For example, a tolerable temperature of the material of the blocking region 120 is higher than or equal to 200° C. so as to prevent from decreasing a service life of the blocking region resulted by an excessively higher evaporation temperature during a high temperature evaporation process.

As illustrated in FIG. 2, a plurality of perforated structure 121 is disposed in an area of the blocking region 120 closer to each blocking region 110. It should be explained that, FIG. 2 is a schematic diagram illustrating an exemplary perforated structure 121 in the blocking region 120, and an actual size of the perforated structure 121 is extremely small.

For example, the via holes 121 in the blocking region 120 are illustrated in FIG. 2 as arranging in a single circle surrounding each evaporation region 110 by way of example, without limiting the present embodiment thereto; e.g., the via holes 121 may also be arranged in two circles and the like. For example, the plurality of via holes 121 may have identical sizes or different sizes.

For example, the plurality of via holes 121 is disposed in an annular area which surrounds each evaporation region 110 and has a width of 60 microns. For example, a portion of the light-emitting layer that doesn't need to emit light may be existed in an area blocked by the blocking region 120; by limiting the size of the opened structure 111 in the evaporation region 110 of the evaporation mask 100 to a certain extent, a size level of a portion of the light-emitting layer configured to emit light is smaller than that of the opened structure 111 of the evaporation mask 100. For example, the area on the substrate to be evaporated that is blocked by the blocking region 120 contains a portion of the light-emitting layer, which portion is arranged in two circles and is not required to emit light. The portion of the light-emitting layer arranged in two circles is disposed in an annular area which surrounds each evaporation region 110 and has a width of 60 microns, without limiting the present embodiment thereto. In the present embodiment, a plurality of via holes 121 is disposed in every area adjacent to the evaporation region 110 so as to reduce the adhesion force of the large particles in this area, and hence to reduce the amount of the large particles covering the edge of the evaporation region 110 which may affect the evaporation effect. Further, it can also prevent the large particles from aggregating in this area to cause uneven evaporation and generate dark spots of different levels, thereby improving the evaporation effect of the display region. In addition, by reducing large particles attaching onto this area, it can reduce a probability of particles attaching onto the periphery of the scanning drive circuit region and a printing region of a glass cement layer, so as to avoid an occurrence of dark spots of different degrees and also avoid issues such as uneven bonding and air leakage resulted by the large particles.

For example, the plurality of via holes 121 is configured to penetrate through the blocking region, without limiting the present embodiment thereto.

For example, considering the requirement of preventing the evaporation material from affecting a non-display region on the substrate blocked by the blocking region 120, each cross section of the plurality of via holes 121 taken along a direction parallel to the evaporation mask 100 has a maximum size in a range from 30 microns to 60 microns, without limiting the present embodiment thereto. It should be explained that, according to actual demands, the maximum size of each cross section of the plurality of via holes 121 taken along the direction parallel to the evaporation mask 100 may also be smaller than 30 microns.

For example, as illustrated in FIG. 2, each of the plurality of via holes 121 has a rectangular shape, and the maximum size of each cross section of the plurality of via holes 121 taken along the direction parallel to the evaporation mask 100, that is, a diagonal length of the rectangle is in a range from 30 microns to 60 microns. However, the embodiment of the present disclosure is not limited thereto. For example, the perforated structure may have a rhombohedral shape or the like.

For example, each cross section of the plurality of via holes 121 taken along the direction parallel to the evaporation mask 100 has a shape including circle and polygon. For example, when the perforated structure 121 is in a shape of circle, the maximum size of each cross section of the plurality of via holes 121 taken along the direction parallel to the evaporation mask 100 is just a diameter of the circle. It should be explained that, the shape of the perforated structure 121 is not limited herein.

For example, the maximum size of each cross section of the plurality of via holes 121 taken along the direction parallel to the evaporation mask 100 is 50 microns.

For example, an interval of the plurality of via holes 121 is in a range from 30 microns to 40 microns, without limiting the present embodiment thereto.

The Second Embodiment

Figure 3:
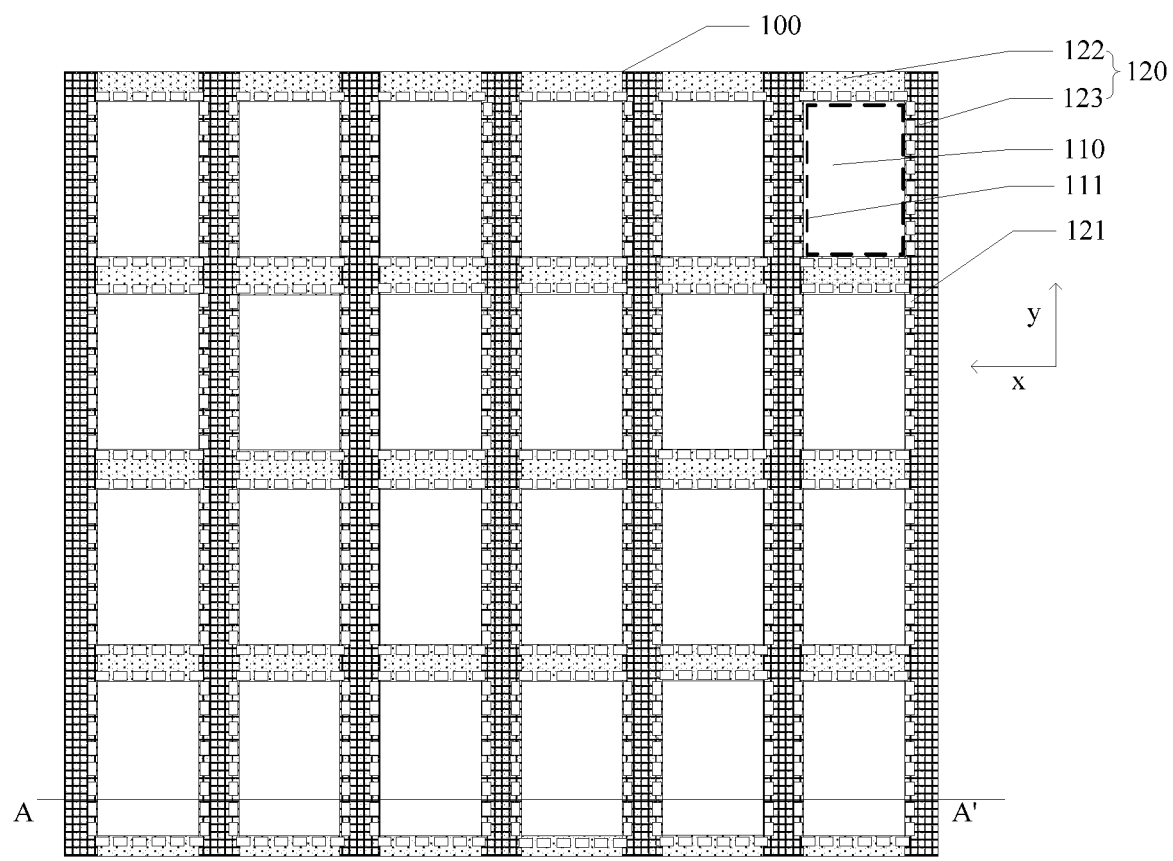
FIG. 3 is a schematic diagram illustrating an evaporation mask provided by another embodiment of the present disclosure.

The present embodiment provides an evaporation mask, as illustrated in FIG. 3, the blocking region 120 of the evaporation mask 100 includes a plurality of first blocking bars 122 and a plurality of second blocking bars 123; the plurality of first blocking bars 122 extends along a first direction, and the plurality of second blocking bars 123 extends along a second direction; and the first blocking bars 122 are disposed to be intersected with the second blocking bars 123. Herein, the first direction refers to a x direction in FIG. 3, and the second direction refers to a direction perpendicular to the x direction, that is, a y direction. It should be explained that, the first direction and the second direction may be exchanged, and an included angle between the first direction and the second direction is not limited to 90 degrees as illustrated in FIG. 3. For example, the first blocking bars 122 and the second blocking bars 123 are intersected to define a plurality of areas of evaporation regions 110 so that each of the evaporation regions 110 is integrally formed as an opened structure 111. The first blocking bar 122 and the second blocking bar 123 are provided with a plurality of opened structures 121. It should be explained that, FIG. 3 is a schematic diagram illustrating an exemplary perforated structure 121, and an actual size of the perforated structure 121 is extremely small. For example, the via holes 121 in the plurality of first blocking bars 122 and the plurality of second blocking bars 123 are illustrated in FIG. 3 as arranging in a single circle surrounding each evaporation region 110 by way of example, without limiting the present embodiment thereto; e.g., the via holes 121 may also be arranged in two circles and the like. For example, the plurality of via holes 121 may have identical sizes or different sizes. For example, the plurality of via holes 121 is disposed in an annular area which surrounds each evaporation region 110 and has a width of 60 microns.

As illustrated in FIG. 3, for example, the plurality of first blocking bars 122 and the plurality of second blocking bars 123 are disposed to be intersected vertically to define a plurality of evaporation regions 110 each having a rectangular shape. That is, each of the evaporation regions 110 is integrally formed into a rectangular-shaped opened structure 111. For example, the above-mentioned rectangular shape may also include a square shape. Of course, the embodiment of the present disclosure is not limited thereto.

For example, the plurality of via holes 121 is disposed in an area of the first blocking bar 122 and the second blocking bar 123 adjacent to edge sides of each of the evaporation regions 110. For example, in the present embodiment, the plurality of via holes 121 is disposed in the first blocking bars 122 and the second blocking bars 123 by etching without limiting the present embodiment thereto. Because an area on the first blocking bar 122 and the second blocking bar 123 that allows particles to be attached is reduced, the adhesive force of the particles is decreased correspondingly, which on one hand makes part of the lager particles difficult to be attached onto the first blocking bar 122 and the second blocking bar 123, and on the other hand makes the even larger particles generated by the particles attached on the first blocking bar 122 and the second blocking bar 123 aggregating in subsequent evaporation process easily to be separated from the substrate to be evaporated, thereby improving the evaporation effect and also the uniformity of the display region, and ensuring a normal condition at the periphery region for display.

As illustrated in FIG. 3, for example, each first blocking bar 122 and each second blocking bar 123 are separately formed and then welded together. Generally, a blocking region of an evaporation mask is integrally formed into a metallic frame. In such case, large particles generated by the evaporation source are liable to be attached onto the blocking region. When such large particles attached onto the blocking region heavily affect the evaporation effect, the entire blocking region has to be replaced, which results in a waste of source. In the present embodiment, the plurality of first blocking bars 122 and second blocking bars 123 are separately formed and then welded together in a manner of vertical intersection, so as to define a plurality of evaporation regions 110 each having a rectangular shape. When the large particles attached onto any of the blocking bars affect the evaporation effect, this blocking bar can be individually disassembled and a new blocking bar may be welded as a replacement, with other blocking regions having not affected the evaporation effect being reused. In this way, most of the blocking bars in the evaporation mask 100 can be reused, thereby saving the material.

For example, the blocking bars disposed around each evaporation region 110 of the evaporation mask 100 may be separately welded. That is, two first blocking bars 122 and two second blocking bars 123 are intersected to surround one evaporation region 110 so as to form one evaporation mask unit, in which any of the first blocking bars 122 and any of the second blocking bars 123 may separate the evaporation regions 110 of adjacent evaporation mask units from each other. When large particles attached onto any one of the blocking bars around each evaporation region 110 affect the evaporation effect, this blocking bar may be individually disassembled and a new blocking bar may be welded as a replacement, with other blocking regions having not affected the evaporation effect being reused. In this way, most of the blocking bars in the evaporation mask 100 can be reused, thereby saving the material.

For example, two first blocking bars 122 and two second blocking bars 123 at edges of the evaporation mask 100 may be integrally formed as an outermost frame of the evaporation mask 100. Both ends of each of other first blocking bars 122 and second blocking bars 123 may be welded to this frame to form the blocking region 120.

For example, each evaporation region 110 may have other shapes such as polygon and circle. According to a pattern shape required by the substrate to be evaporated, the blocking bars of the blocking region 120 may define the evaporation regions 110 to have a shape identical with that of the pattern shape required by the substrate to be evaporated, for example, polygon, rectangle or circle. In such case, the evaporation mask 100 provided by the present embodiment can be applied in evaporation processes of substrates required for different pattern shapes only by re-welding the blocking bar(s), which decreases a development cost of the evaporation mask 100.

For example, a material of each of the plurality of first blocking bars 122 and each of the plurality of second blocking bars 123 may include resin material or metallic material. The metallic material may be one or more selected from the group consisted of stainless steel, nickel (Ni), cobalt (Co), Ni-alloy and Ni—Co-alloy, without limiting the present embodiment thereto.

The Third Embodiment

Figure 4:
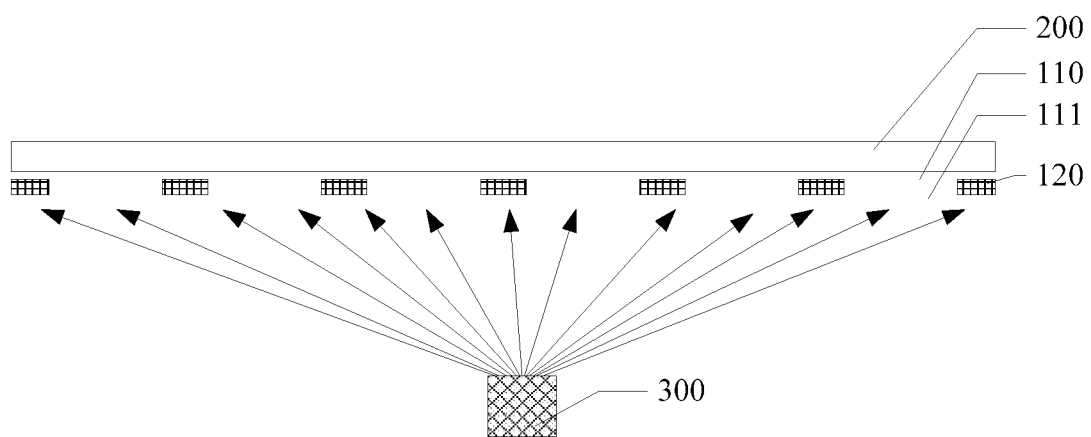
FIG. 4 is a schematic diagram illustrating an evaporation method provided by an embodiment of the present disclosure.

The present embodiment provides an evaporation method, as illustrated in FIG. 4, including: forming a film layer having a same shape with that of the opened structure 111 on the substrate 200 to be evaporated by utilizing any of the above-mentioned evaporation masks. For example, the film layer includes a common layer to be evaporated, without limiting the present embodiment thereto. The blocking region 120 on the evaporation mask is illustrated as a sectional view taken along direction A-A' in FIG. 3 in which the perforated structure 121 in the blocking region 120 is not illustrated.

For example, an evaporation source 300 is located at a side of the evaporation mask, and the substrate 200 to be evaporated is located at the other side of the evaporation mask opposite to the evaporation source 300. For example, as illustrated in FIG. 4, the evaporation source 300 is located below the evaporation mask, and the substrate 200 to be evaporated is located above the evaporation mask. When the evaporation source 300 is used to evaporate an evaporation material onto the substrate 200 to be evaporated, the blocking region 120 can prevent the evaporation material from being evaporated onto an area on the substrate 200 to be evaporated on which the blocking region 120 is disposed. Through the opened structures 111 of the plurality of evaporation regions 110, the evaporation source 300 evaporates the common layer on the substrate 200, for example, the common layer is a metallic film layer or an organic film layer.

For example, the plurality of via holes 121 located in the blocking region 120 of the evaporation mask is disposed in an annular region which surrounds each of the evaporation regions 110 and has a width of 60 microns, without limiting the present embodiment thereto. The plurality of via holes 121 disposed in the blocking region 120 on one hand makes large particles difficult to be attached onto the blocking region 120, and on the other hand makes part of the large particles attached onto the blocking region to be separated due to gravity upon forming into even larger particles by gathering with other small particles during evaporating subsequent common layer(s). Therefore, it reduces the amount of large particles as attached and improves the evaporation effect.

It should be explained that, the present disclosure is described with reference to the case of evaporating a common layer of an OLED display panel by using the evaporation mask by way of example, without limiting the present embodiment thereto. For example, other substrates or other layers are also possible. It should be explained that, the common layer evaporated by each evaporation region 110 corresponds to a common layer of one OLED display substrate. Therefore, the evaporation mask including a plurality of evaporation regions 110 arranged in an array can be applied in evaporating a plurality of substrates to be evaporated at the same time.

For example, at least one of the common layers is depending on the material and the luminous property of the light-emitting layer. For example, the common layer may include at least one of a hole transmission layer, an electron transmission layer, a hole injection layer, an electron injection layer, a hole barrier layer, an electron barrier layer and a cathode layer.

For example, the hole injection layer may include a conductive polymer with a metal composition. The hole injection layer may include phthalocyanine compound including copper phthalocyanine, polyaniline/dodecylbenzene sulfonic acid, polyaniline/camphorsulfonic acid or polyaniline, and the like. However, the hole injection layer is not limited thereto.

For example, the hole transmission layer may include carbazole derivatives such as polyvinyl carbazole, or amine derivatives with condensed Aromatic ring. However, the hole transmission layer is not limited thereto.

For example, the electron transmission layer is formed on the light-emitting layer, and may include a material such as quinoline derivative to improve an electron mobility, so as to achieve a charge balance. However, the electron transmission layer is not limited thereto.

For example, the electron injection layer is formed on the electron transmission layer, and includes a material such as lithium fluoride, sodium chloride and barium oxide. However, the electron injection layer is not limited thereto.

For example, the cathode layer may be formed of a material with high conductivity and low work function. The material of the cathode layer may be Li, Mg, Ca, Al, Ag, Ba or an alloy thereof. However, the material of the cathode layer is not limited thereto.

For example, the evaporation region 110 is not limited to be configured to evaporate the common layer as mentioned above, but may also be utilized to evaporate an optical enhancement film layer of an OELD display device and the like, without limiting the present disclosure thereto.

In the evaporation method of the present embodiment, by using the above-mentioned evaporation mask to evaporate the common layer, the display effect of the OLED display device can be improved, a normal condition of the periphery region for display is ensured, and hence the yield of product appearance detection is guaranteed.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The foregoing are merely specific embodiments of the invention, but not limitative to the protection scope of the invention. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

The application claims priority of Chinese patent application No. 201611075496.4 filed with the SIPO on Nov. 30, 2016, the entire disclosure of which is incorporated herein by reference as part of the present application.

What is claimed is:

1. An evaporation mask, comprising:
a plurality of evaporation regions arranged in an array, each of the plurality of evaporation regions being integrally formed as an opened structure; and
a blocking region disposed to surround each of the evaporation regions to separate adjacent evaporation regions,
the blocking region being provided with a plurality of via holes,
wherein the blocking region comprises a plurality of first blocking bars and a plurality of second blocking bars; the plurality of first blocking bars extends along a first direction, the plurality of second blocking bars extends along a second direction; and the first blocking bars is disposed to be intersected with the second blocking bars.

2. The evaporation mask according to claim 1, wherein the plurality of via holes is disposed in an area of the blocking region close to each of the evaporation regions.

3. The evaporation mask according to claim 1, wherein the plurality of via holes is configured to penetrate through the blocking region.

4. The evaporation mask according to claim 1, wherein the plurality of via holes is disposed in an annular area which surrounds each of the evaporation regions.

5. The evaporation mask according to claim 1, wherein each cross section of the plurality of via holes taken along a direction parallel to the evaporation mask has a maximum size which is in a range from 30 microns to 60 microns.

6. The evaporation mask according to claim 1, wherein an interval of the plurality of via holes is in a range from 30 microns to 40 microns.

7. The evaporation mask according to claim 1, wherein each cross section of the plurality of via holes taken along a direction parallel to the evaporation mask has a shape comprising circle or polygon.

8. The evaporation mask according to claim 1, wherein the first blocking bars and the second blocking bars are disposed to be intersected vertically to define a plurality of evaporation regions each having a rectangular shape.

9. The evaporation mask according to claim 1, wherein a shape of each of the evaporation regions comprises polygon or circle.

10. The evaporation mask according to claim 1, wherein a shape of the opened structure in the evaporation region is identical to that of a common layer to be evaporated.

11. The evaporation mask according to claim 10, wherein the common layer comprises at least one of a hole transmission layer, an electron transmission layer, a hole injection layer, an electron injection layer, a hole barrier layer, an electron barrier layer and a cathode layer.

12. An evaporation method, comprising: evaporating a film layer having a shape identical to that of the perforated structure on a substrate by utilizing the evaporation mask according to claim 1.

13. The evaporation method according to claim 12, wherein the film layer comprises a common layer to be evaporated.

14. The evaporation method according to claim 13, wherein evaporating the common layer comprises evaporating at least one of a hole transmission layer, an electron transmission layer, a hole injection layer, an electron injection layer, a hole barrier layer, an electron barrier layer and a cathode layer.

15. The evaporation mask according to claim 4, wherein the annular area has a width of 60 microns.

16. The evaporation mask according to claim 2, wherein each cross section of the plurality of via holes taken along a direction parallel to the evaporation mask has a maximum size which is in a range from 30 microns to 60 microns.

17. The evaporation mask according to claim 2, wherein each cross section of the plurality of via holes taken along a direction parallel to the evaporation mask has a shape comprising circle or polygon.

\* \* \* \* \*

UNITED STATES PATENT AND TRADEMARK OFFICE
CERTIFICATE OF CORRECTION

PATENT NO. : 11,104,984 B2
APPLICATION NO. : 16/066222
DATED : August 31, 2021
INVENTOR(S) : Fan Yang, Yinan Liang and Kun Guo Page 1 of 1

It is certified that error appears in the above-identified patent and that said Letters Patent is hereby corrected as shown below:

On the Title Page

Item (71) Applicants:
BOE TECHNOLOGY GROUP CO., LTD, Beijing (CN)
ORDOS YUANSHENG OPTOELECTRONICS CO., LTD., Inner Mongolia (CN)

Is changed to:
BOE TECHNOLOGY GROUP CO., LTD., Beijing (CN)
ORDOS YUANSHENG OPTOELECTRONICS CO., LTD., Inner Mongolia (CN)

Signed and Sealed this
Twenty-fifth Day of January, 2022

Drew Hirshfeld
*Performing the Functions and Duties of the
Under Secretary of Commerce for Intellectual Property and
Director of the United States Patent and Trademark Office*